United States Patent
Glacer et al.

(10) Patent No.: US 11,081,551 B2
(45) Date of Patent: Aug. 3, 2021

(54) METHOD FOR PRODUCING A GRAPHENE-BASED SENSOR

(71) Applicant: Infineon Technologies AG, Neubiberg (DE)

(72) Inventors: Christoph Glacer, Munich (DE); Stephan Pindl, Ergoldsbach (DE); Werner Weber, Munich (DE); Sebastian Wittmann, Velburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/548,144

(22) Filed: Aug. 22, 2019

(65) Prior Publication Data

US 2020/0066845 A1    Feb. 27, 2020

(30) Foreign Application Priority Data

Aug. 23, 2018   (DE) .......................... 102018214302.1

(51) Int. Cl.
| | |
|---|---|
| H01L 21/20 | (2006.01) |
| H01L 21/36 | (2006.01) |
| H01L 29/16 | (2006.01) |
| H01L 23/532 | (2006.01) |
| B01D 71/02 | (2006.01) |
| H01L 21/02 | (2006.01) |

(52) U.S. Cl.
CPC .... *H01L 29/1606* (2013.01); *H01L 23/53204* (2013.01); *B01D 71/021* (2013.01); *B01L 2300/0645* (2013.01); *H01L 21/02527* (2013.01); *H01L 21/02603* (2013.01)

(58) Field of Classification Search
CPC ... H01L 2221/00; B82Y 5/00; B81C 2201/00; H01B 13/0016; H01B 13/0026; C01B 31/0453; C23C 16/27
USPC ........... 977/700; 700/742, 752; 257/19, 190, 257/414, 415, 418; 438/216, 257
See application file for complete search history.

(56) References Cited

U.S. PATENT DOCUMENTS

| | | | | |
|---|---|---|---|---|
| 8,901,666 | B1 * | 12/2014 | Meade | ................ H01L 29/7781 257/369 |
| 9,714,988 | B2 * | 7/2017 | Eckinger | ............... H01L 43/065 |
| 2014/0261998 | A1 * | 9/2014 | Veerasamy | ............. C23C 26/00 156/247 |

(Continued)

OTHER PUBLICATIONS

Hong, Jin-Yong et al., "A Rational Strategy for Graphene Transfer on Substrates with Rough Features", Advanced Materials, vol. 28, www.advmat.de, www.materialsviews.com, Jan. 25, 2016, pp. 2382-2392.

*Primary Examiner* — Ismail A Muse
*Assistant Examiner* — David W Houston, III
(74) *Attorney, Agent, or Firm* — Slater Matsil, LLP

(57) ABSTRACT

In accordance with an embodiment, a method for producing a graphene-based sensor includes providing a carrier substrate; forming a carrier structure on the carrier substrate, wherein one or more separating structures are formed on an upper side of the carrier structure; and performing a wet chemical transfer of a graphene layer onto the upper side of the carrier structure that comprises the separating structures, where the separating structures and a tear strength of the graphene layer are matched to one another such that the graphene layer respectively tears at the separating structures during the wet chemical transfer.

19 Claims, 22 Drawing Sheets

(56) References Cited

U.S. PATENT DOCUMENTS

| | | | |
|---|---|---|---|
| 2014/0284616 A1* | 9/2014 | Dimitrakopoulos | ............................ H01L 21/304 257/77 |
| 2014/0308523 A1* | 10/2014 | Veerasamy | ............ C01B 32/186 428/408 |
| 2015/0104623 A1* | 4/2015 | Hong | ..................... B82Y 10/00 428/195.1 |
| 2016/0176162 A1* | 6/2016 | Johnson | .................. B32B 37/18 428/426 |
| 2016/0233447 A1* | 8/2016 | Kim | ..................... H01L 51/0094 |
| 2017/0324166 A1* | 11/2017 | Wang | ..................... C01B 32/186 |
| 2018/0201511 A1* | 7/2018 | Ruhl | ................... B81C 1/00658 |

* cited by examiner

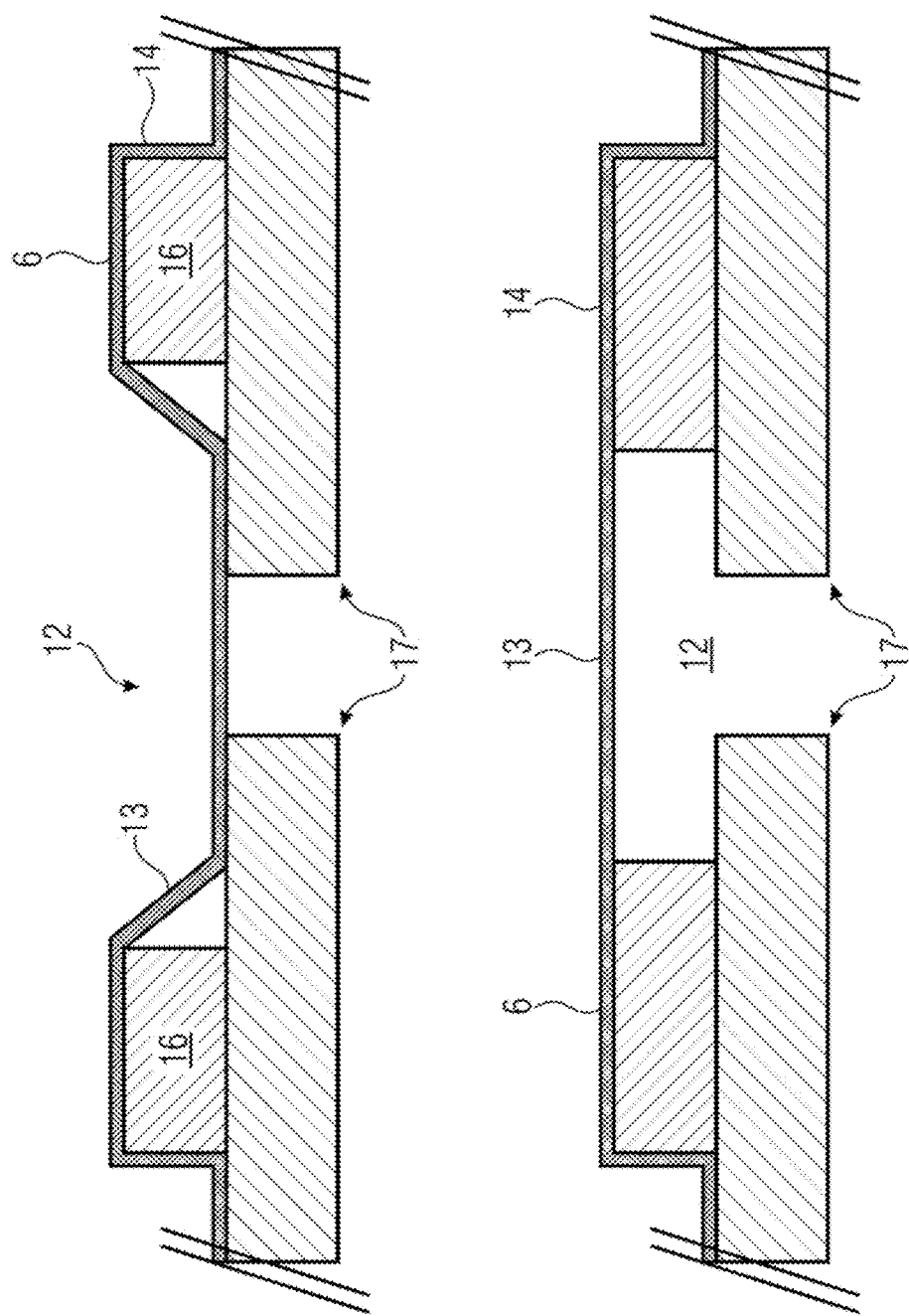

METHOD FOR PRODUCING A GRAPHENE-BASED SENSOR

This application claims the benefit of German Application No. 102018214302.1, filed on Aug. 23, 2018, which application is hereby incorporated herein by reference.

TECHNICAL FIELD

The present disclosure relates to the production of a graphene-based sensor. In particular, the disclosure relates to a method for producing a graphene-based sensor, during which a graphene layer is applied onto a carrier structure by wet chemical transfer.

BACKGROUND

During the production of such graphene-based sensors, the problem arises that the graphene layer covers the entire carrier structure, and undesired stray resistances, capacitances, etc. are therefore formed. In order to avoid such undesired stray resistances, capacitances, etc., it has been proposed to structure the graphene layer before or after the transfer so that only the desired regions on the carrier structure are covered with graphene. However, structuring of the graphene layer is scarcely possible with conventional methods of semiconductor technology (partial covering and etching of the structure).

It is known to carry out structuring of the graphene layer, during which the graphene layer is removed from the undesired regions on the carrier structure, by means of a laser. To this end, however, the undesired region must be irradiated by the laser with a high power, for example more than 10 milliwatts, over a prolonged period of time, for example several minutes to several hours. However, such a method is uneconomical, in particular when relatively large batch numbers of the graphene-based sensor are intended to be produced. This is because, if this method were to be applied at the level of a wafer, removal of the graphene from the undesired regions on the carrier structures would take several days.

There is therefore a need for a more economical method for producing a graphene-based sensor, during which a graphene layer is applied onto a carrier structure by wet chemical transfer.

SUMMARY

In accordance with an embodiment, a method for producing a graphene-based sensor includes providing a carrier substrate; forming a carrier structure on the carrier substrate, wherein one or more separating structures are formed on an upper side of the carrier structure; and performing a wet chemical transfer of a graphene layer onto the upper side of the carrier structure that comprises the separating structures, where the separating structures and a tear strength of the graphene layer are matched to one another such that the graphene layer respectively tears at the separating structures during the wet chemical transfer.

BRIEF DESCRIPTION OF THE DRAWINGS

Embodiments are described below with reference to the appended figures, in which:

FIG. 22 shows steps of a further exemplary embodiment of a method for producing a graphene-based sensor, the graphene-based sensor respectively being represented in a sectional side view.

DETAILED DESCRIPTION OF ILLUSTRATIVE EMBODIMENTS

Figure 1:
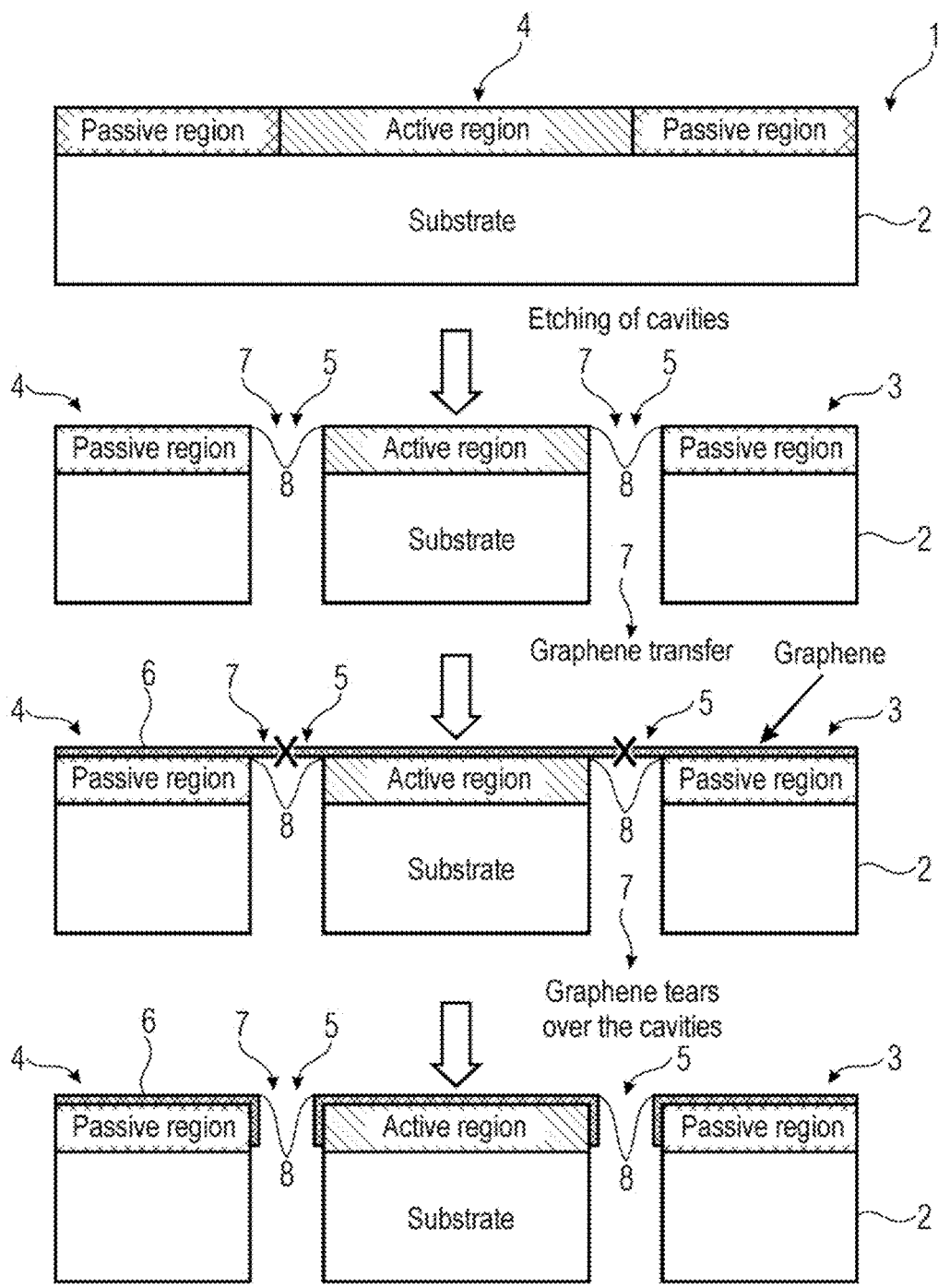
FIG. 1 shows steps of an exemplary embodiment of a method for producing a graphene-based sensor, the graphene-based sensor being represented in a schematic sectional side view.

A method for producing a graphene-based sensor is disclosed, where the method includes the following steps: provision of a carrier substrate; formation of a carrier structure on the carrier substrate, in such a way that one or more separating structures are formed on an upper side of the carrier structure; and wet chemical transfer of a graphene layer onto the upper side of the carrier structure, which comprises the separating structures; wherein the separating structures and a tear strength of the graphene layer are matched to one another in such a way that the graphene layer respectively tears at the separating structures during the wet chemical transfer.

In what follows, spatial terms such as up or down refer to a position of the graphene-based sensor in space in which the carrier structure is oriented in a normal position parallel to the Earth's surface, and in which the carrier structure is placed above the carrier substrate.

The substrate may be a semiconductor substrate, for example a silicon substrate. The carrier substrate may be used as a basis for further construction of the graphene-based sensor.

The carrier structure is firstly used to carry the graphene layer. The term "structure" refers to the fact that the configuration of the surface of the carrier structure differs from a flat plane. The carrier structure may be produced by structuring the substrate itself and/or by applying one or more structured layers. In this case, separating structures are formed on the carrier structure, which are used to make the graphene layer tear in a defined way during the wet chemical transfer onto the upper side of the carrier structure, so that a high electrical resistance is locally achieved between different regions of the graphene layer.

Graphene is the name for an allotrope of carbon with a two-dimensional structure, in which each carbon atom is surrounded at an angle of 120° by three further carbon atoms, so that a honeycomb pattern is formed. A graphene layer is therefore very thin, but nevertheless very tear-resistant. Wet chemical transfer of a graphene layer is intended to mean transfer during which the graphene layer is separated from a carrier material, for example copper, by means of a solvent, for example aqueous hydrogen chloride, and during which the graphene layer wetted with the solvent is then transferred onto the carrier structure.

In this case, the method is carried out in such a way that the separating structures and a tear strength of the graphene layer are matched to one another in such a way that the graphene layer respectively tears at the separating structures during the wet chemical transfer. The proposed production method is thus based on the surprising discovery that a per se very tear-resistant graphene layer can be made to tear in a defined way during the wet chemical transfer by the formation of separating structures on the carrier structure.

The advantage of this solution is its simple technological implementation, since the graphene layer no longer needs to be removed in the undesired regions. In this way, undesired stray effects in the graphene-based sensor may be avoided, so that the accuracy and the sensitivity of the graphene-based sensor can be increased.

In exemplary embodiments of the method, at least one of the separating structures is configured as an indentation. The indentation may, for example, be a trench.

In exemplary embodiments of the method, the carrier structure is configured in such a way that the indentation is linear and comprises at least one edge extending along the indentation. The indentation may in this case be configured in a straight line or curvilinearly.

In exemplary embodiments of the method, the carrier structure is configured in such a way that at least one of the separating structures is configured as an elevation. The elevation may, in particular, be configured in the manner of a dam.

In exemplary embodiments of the method, the carrier structure is configured in such a way that the elevation is linear and comprises at least one edge extending along the elevation. The elevation may also be configured in a straight line or curvilinearly.

It has been found that separating structures configured as an elevation or indentation are suitable for making a graphene layer tear in a controlled way during wet chemical transfer. The precise mechanism of this is not known in detail. It is, however, suspected that capillary forces in the solvent play a role. The person skilled in the art may, however, determine the required specific configuration of the separating structures as a function of the graphene layer respectively used by simple tests. It has been found that an angular configuration of the elevation or the indentation promotes tearing of the graphene layer in comparison with a rounded configuration of the elevation or the indentation.

In exemplary embodiments of the method, the carrier structure is configured in such a way that the linear elevation of the at least one separating structure is a conductor track. Conductor tracks are used in many cases in sensors in order to supply the sensor with energy or to extract a measurement signal. In this case, it may be desirable to electrically decouple the conductor track at least locally from the graphene layer. By configuration of the conductor track as a separating structure, this may be achieved without other separating structures being required.

In exemplary embodiments of the method, the carrier structure is configured in such a way that at least one of the separating structures comprises a hydrophobic surface. It has been found that tearing of the graphene layer is promoted when the respective separating structure is at least partially configured to be hydrophobic, i.e., water-repellent.

In exemplary embodiments of the method, the carrier structure is configured in such a way that it comprises an opening, and the wet chemical transfer is carried out in such a way that a first section of the graphene layer covers the opening, and that a second section of the graphene layer covers a region of the carrier structure surrounding the opening. In this way, such sensors, in which provision is made to arrange a conductive material over an opening, may be produced simply.

In exemplary embodiments of the method, the carrier structure is configured in such a way that the graphene layer tears at the separating structures during the wet chemical transfer, in such a way that at least a part of the second section of the graphene layer is electrically separated from the first section of the graphene layer. In this way, stray effects may be reduced without subsequent processing of the graphene layer.

In exemplary embodiments of the method, the carrier structure is configured in such a way that a frame of the opening is configured as a contact structure having one or more contacts, wherein the contacts are electrically connected to the first section of the graphene layer, and wherein the contacts are respectively configured as one of the separating structures. In this way, contacts electrically conductively connected to the first section may be electrically decoupled at least locally from the second section, without other separating structures being required for this.

In exemplary embodiments of the method, a sag limiting structure is formed at the opening, which limits sagging of the first section of the graphene layer during the wet chemical transfer of the graphene layer. In this way, it is possible to prevent the graphene layer from unintentionally tearing in the region of the opening.

In exemplary embodiments of the method, the carrier structure is pre-stressed before the wet chemical transfer of the graphene layer with resilient tensile forces, and wherein the carrier structure is weakened after the wet chemical transfer of the graphene layer in such a way that an area of the opening is increased by the resilient tensile forces. In this way, the graphene layer may be tensioned in the region of the opening, so that any sagging of the graphene layer in the region of the opening can be avoided. The resilient tensile forces may, for example, be generated by a resilient layer in the carrier structure.

In exemplary embodiments of the method, the carrier structure is weakened by removing one or more sacrificial structures of the carrier layer. The sacrificial structures may be arranged outside the resilient layer and, for example, removed by etching.

In exemplary embodiments of the method, the sensor is configured as a Hall sensor, as a microphone or as a pressure sensor, wherein the first section of the graphene layer is configured in order to convert a physical quantity to be detected into an electrical signal.

Elements which are the same or of the same type, or elements which have the same or an equivalent function, are provided below with references which are the same or of the same type.

In the description below, exemplary embodiments having a multiplicity of features of the present invention will be described in more detail in order to impart a better understanding of the invention. It should, however, be mentioned that the present invention may also be implemented while omitting some of the features described. It should also be pointed out that the features presented in various exemplary embodiments may also be combined in another way, if this is not explicitly excluded or would lead to contradictions.

Aspects of the invention which are described in connection with a device also relate to corresponding methods. Similarly, those aspects of the invention which are described in connection with a method also relate to a corresponding device.

FIG. 1 shows steps of an exemplary embodiment of a method for producing a graphene-based sensor 1, the graphene-based sensor 1 being represented in a schematic sectional side view. The exemplary method comprises the following steps: provision of a carrier substrate 2; formation of a carrier structure 3 on the carrier substrate 2, in such a way that one or more separating structures 5 are formed on an upper side 4 of the carrier structure 3; and wet chemical transfer of a graphene layer 6 onto the upper side 4 of the carrier structure 3, which comprises the separating structures 5; wherein the separating structures 5 and a tear strength of the graphene layer 6 are matched to one another in such a way that the graphene layer 6 respectively tears at the separating structures 5 during the wet chemical transfer.

In exemplary embodiments, the carrier structure 3 is configured in such a way that at least one of the separating structures 5 is configured as an indentation 7.

In exemplary embodiments, the carrier structure 3 is configured in such a way that the indentation 7 is linear and comprises at least one edge 8 extending along the indentation 7.

In order to mechanically and electrically separate the graphene layer 6 between different regions of the sensor, trenches 7 may be formed between the different regions on the carrier structure 4, for example by dry reactive-ion etching. By means of these, the graphene layer 6 is induced to tear during the wet chemical transfer because of capillary forces and the matched tear resistance of the graphene layer 6. This leads to electrical separation between the different regions of the sensor 1, and therefore to minimization of undesired stray resistances and capacitances, so that the signal quality and the sensitivity of the sensor 1 increase.

Figure 2:
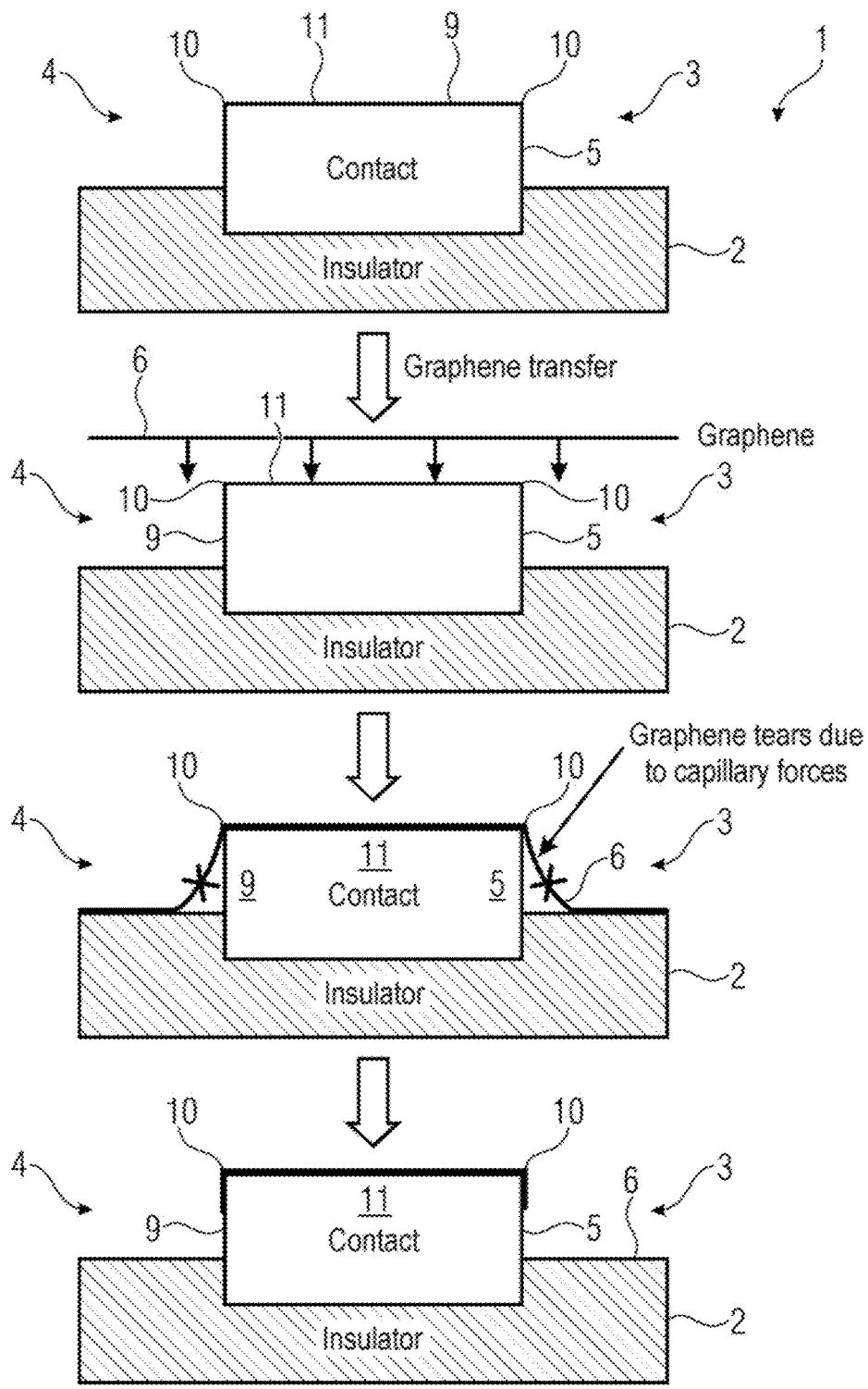
FIG. 2 shows steps of a further exemplary embodiment of a method for producing a graphene-based sensor, the further graphene-based sensor being represented in a schematic sectional side view.

FIG. 2 shows steps of a further exemplary embodiment of a method for producing a graphene-based sensor 1, the further graphene-based sensor 1 being represented in a schematic sectional side view.

In exemplary embodiments, the carrier structure 3 is configured in such a way that at least one of the separating structures 5 is configured as an elevation 9.

In exemplary embodiments, the carrier structure 3 is configured in such a way that the elevation 9 is linear and comprises at least one edge 8 extending along the elevation.

In exemplary embodiments, the carrier structure 3 is configured in such a way that the linear elevation 9 of the at least one separating structure 5 is a conductor track 11.

In exemplary embodiments, the carrier structure 3 is configured in such a way that at least one of the separating structures 5 comprises a hydrophobic surface.

Different regions of the sensor 1 may also be electrically and mechanically separated by configuring an elevation 9 as a separating structure 5. The elevation 9 may be configured in such a way that it comprises one or more defined edges 10. On these edges 10, the graphene layer 6 is pressed during the wet chemical transfer by means of capillary forces which lead to tearing of the graphene layer 6 at this position. The elevation 9 may be a conductor track 11. In this case, in the region of the tearing of the graphene layer 6, an electrical contact between the graphene layer 6 on the conductor track 11 and the graphene layer 6 on neighboring sections of the sensor 1 is broken. This leads to minimization of undesired stray resistances and capacitances, so that the signal quality and the sensitivity of the sensor 1 increase.

Figure 3:
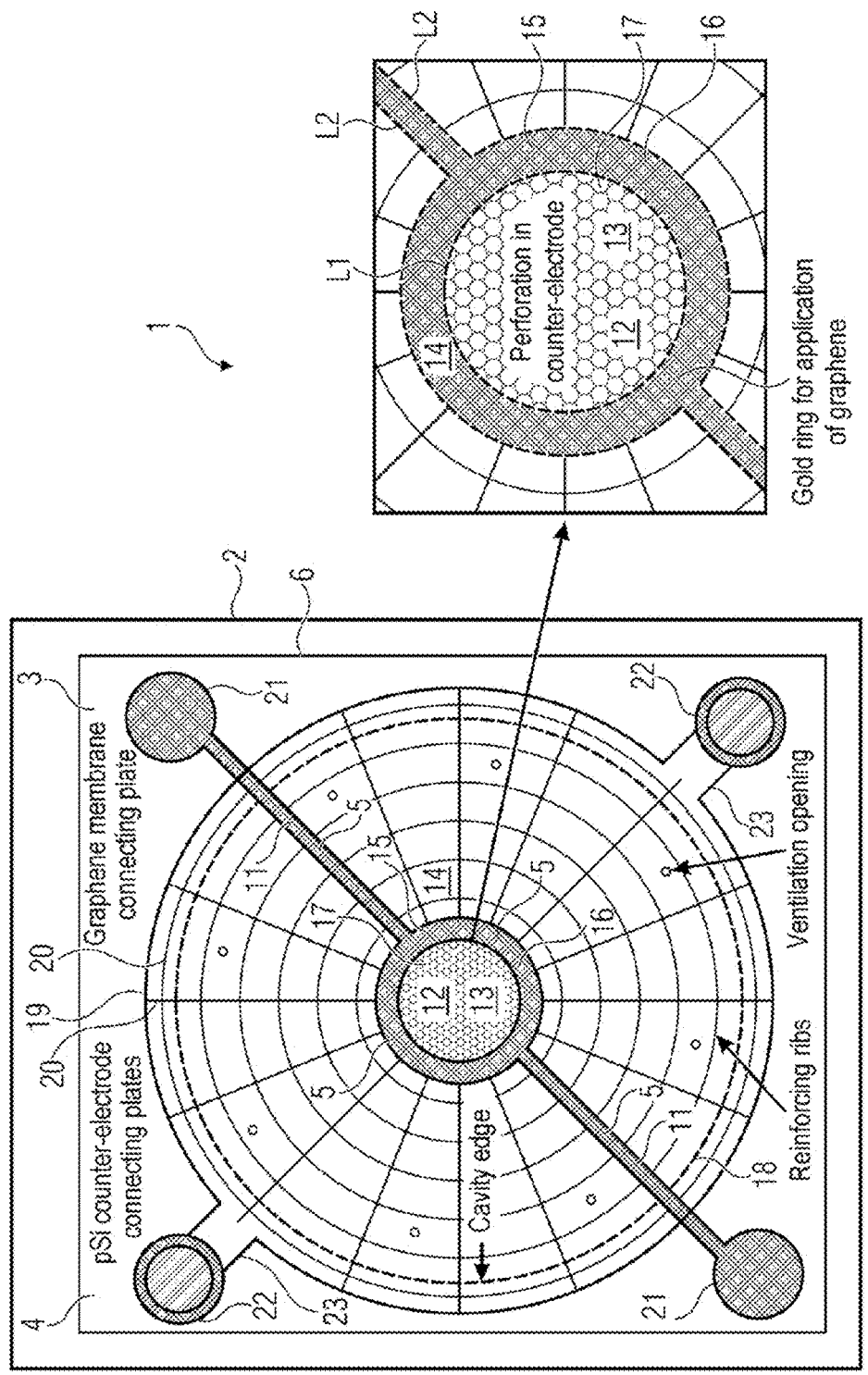
FIG. 3 shows a schematic plan view of an exemplary embodiment of an exemplary graphene-based sensor configured as a microphone.

FIG. 3 shows a schematic plan view of an exemplary embodiment of an exemplary graphene-based sensor 1 configured as a microphone 1.

In exemplary embodiments, the carrier structure 3 is configured in such a way that it comprises an opening 12, and wherein the wet chemical transfer is carried out in such a way that a first section 13 of the graphene layer 6 covers the opening 12, and that a second section 14 of the graphene layer 6 covers a region of the carrier structure 3 surrounding the opening 12.

In exemplary embodiments, the carrier structure 3 is configured in such a way that the graphene layer 6 tears at the separating structures 5 during the wet chemical transfer, in such a way that at least a part of the second section 14 of the graphene layer 6 is electrically separated from the first section 13 of the graphene layer 6.

In exemplary embodiments, the carrier structure 3 is configured in such a way that a frame 15 of the opening 12 is configured as a contact structure having one or more contacts 16, wherein the contacts 16 are electrically connected to the first section of the graphene layer 6, and wherein the contacts 16 are respectively configured as one of the separating structures 5.

In exemplary embodiments, a sag limiting structure 17 is formed at the opening 12, which limits sagging of the first section 13 of the graphene layer 6 during the wet chemical transfer of the graphene layer 6.

In exemplary embodiments, the sensor 1 is configured as a Hall sensor 1, as a microphone 1 or as a pressure sensor, wherein the first section of the graphene layer 13 is configured in order to convert a physical quantity to be detected into an electrical signal.

In the exemplary embodiment of FIG. 3, the graphene layer 6 is represented transparently. The carrier structure 3 is in this case arranged over a cavity 18. The carrier structure 3 in this case comprises a plate-shaped cover 19 with reinforcing ribs 20, two electrode connecting plates 21, which are respectively connected by a conductor track 11 configured as a separating structure 5 to the annular contact 16, and two counter-electrode connecting plates 22, which are respectively connected by means of an electrical connection means 23 to the sag limiting structure 17. The sag limiting structure 17 is in this case configured as a perforated counter-electrode 17 of the microphone 1, while the first section 13 of the graphene layer is configured as an electrode 13 of the microphone 1.

The line L1 in this case represents the separating line between the first section and the second section of the graphene layer 6. The lines L2 represent the tear lines along which the graphene layer 6 tears. The tearing of the graphene layer 6 is in this case induced by edges on the conductor tracks 11 and the contact 16.

The effect of the sag limiting structure 17 is in this case that the graphene layer 6 does not tear over the opening 12 during the wet chemical transfer.

In order to allow static pressure equilibration, the plate-shaped cover may comprise one or more ventilation openings.

Figure 4:
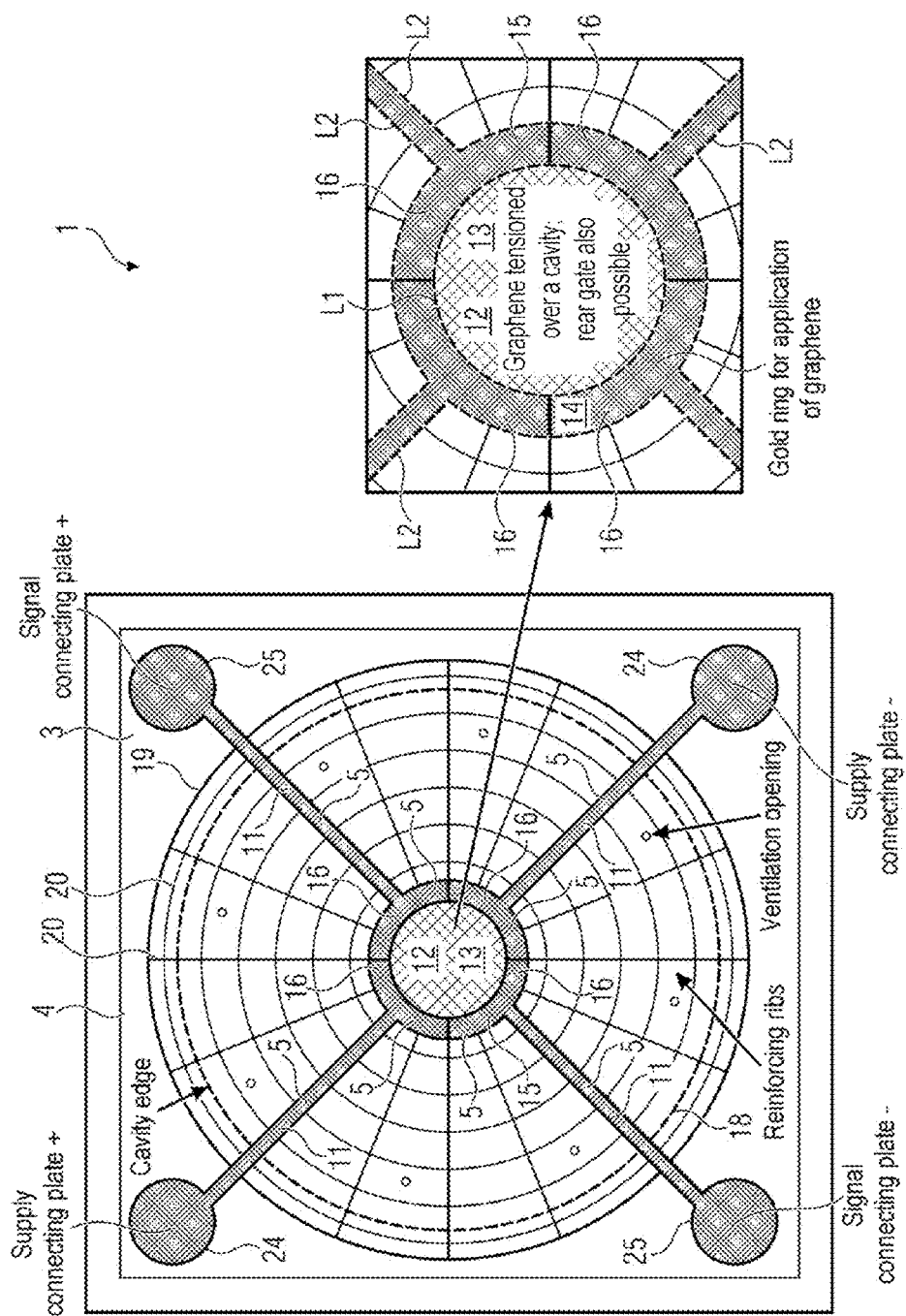
FIG. 4 shows a schematic plan view of an exemplary embodiment of an exemplary graphene-based sensor configured as a Hall sensor.

FIG. 4 shows a schematic plan view of an exemplary embodiment of an exemplary graphene-based sensor 1 configured as a Hall sensor 1.

The Hall sensor 1 of FIG. 4 is based on the microphone of FIG. 3, so that only the differences are explained below. The essential differences are that the border 15 of the opening 12 is now formed by 4 contacts 16 electrically separated from one another, two of the contacts 16 being electrically connected respectively by means of a conductor track 12 respectively to a supply connecting plate 24, and two of the contacts 16 being connected respectively by means of a conductor track 12 respectively to a signal connecting plate 25.

FIGS. 5-18 show the steps of a further exemplary embodiment of a method for producing a graphene-based sensor 1, the graphene-based sensor 1 respectively being represented in a schematic sectional side view. FIGS. 5-16 in this case show the production of the carrier structure 3 on the upper side 4 of the carrier substrate 2.

Figure 5:
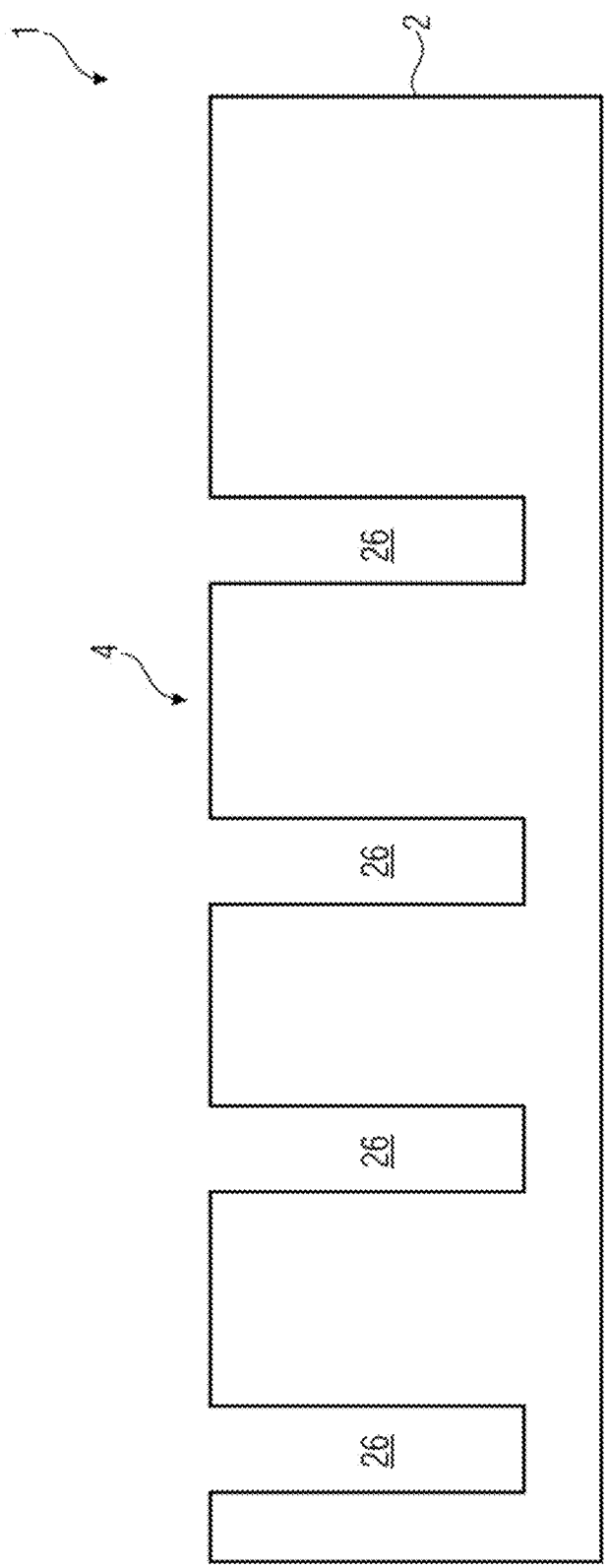
FIGS. 5-18 show steps of a further exemplary embodiment of a method for producing a graphene-based sensor, the graphene-based sensor respectively being represented in a schematic sectional side view.
Figure 6:
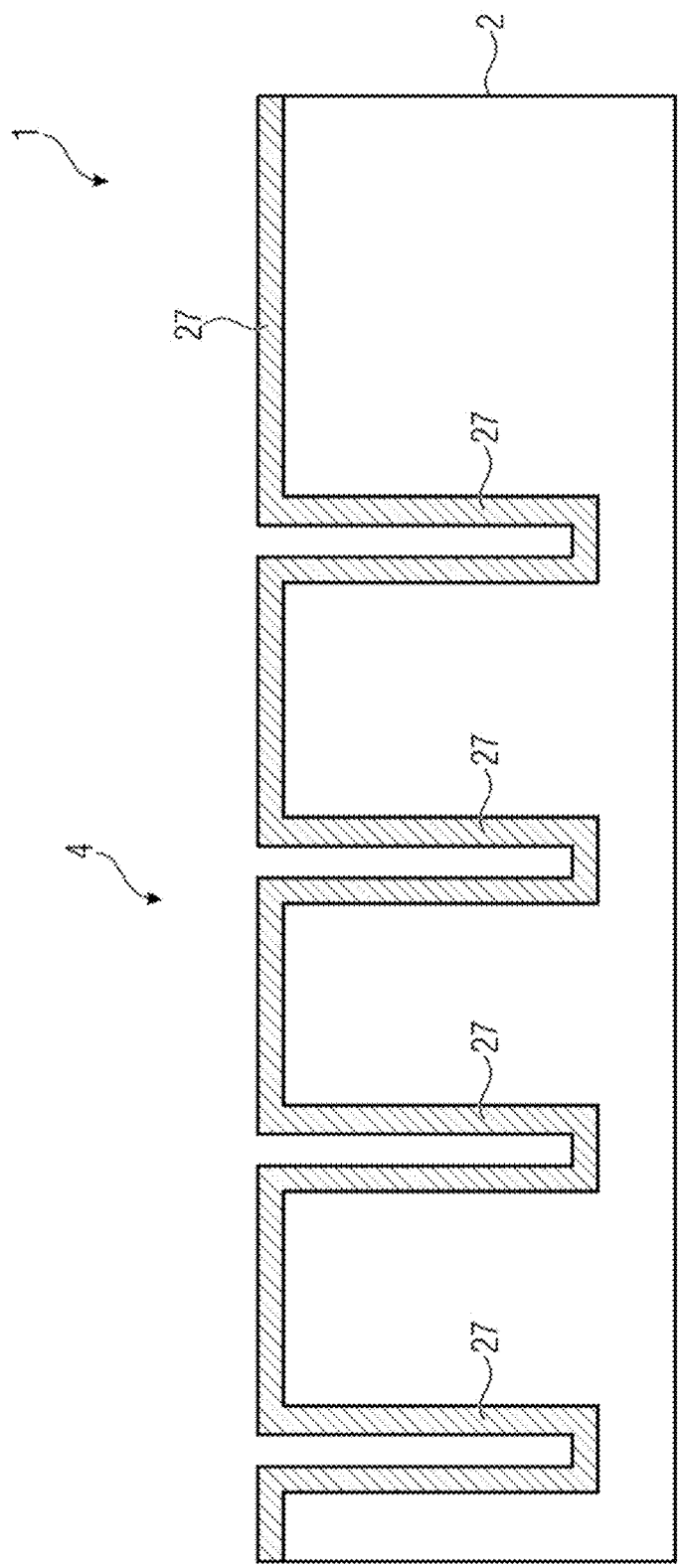
Figure 7:
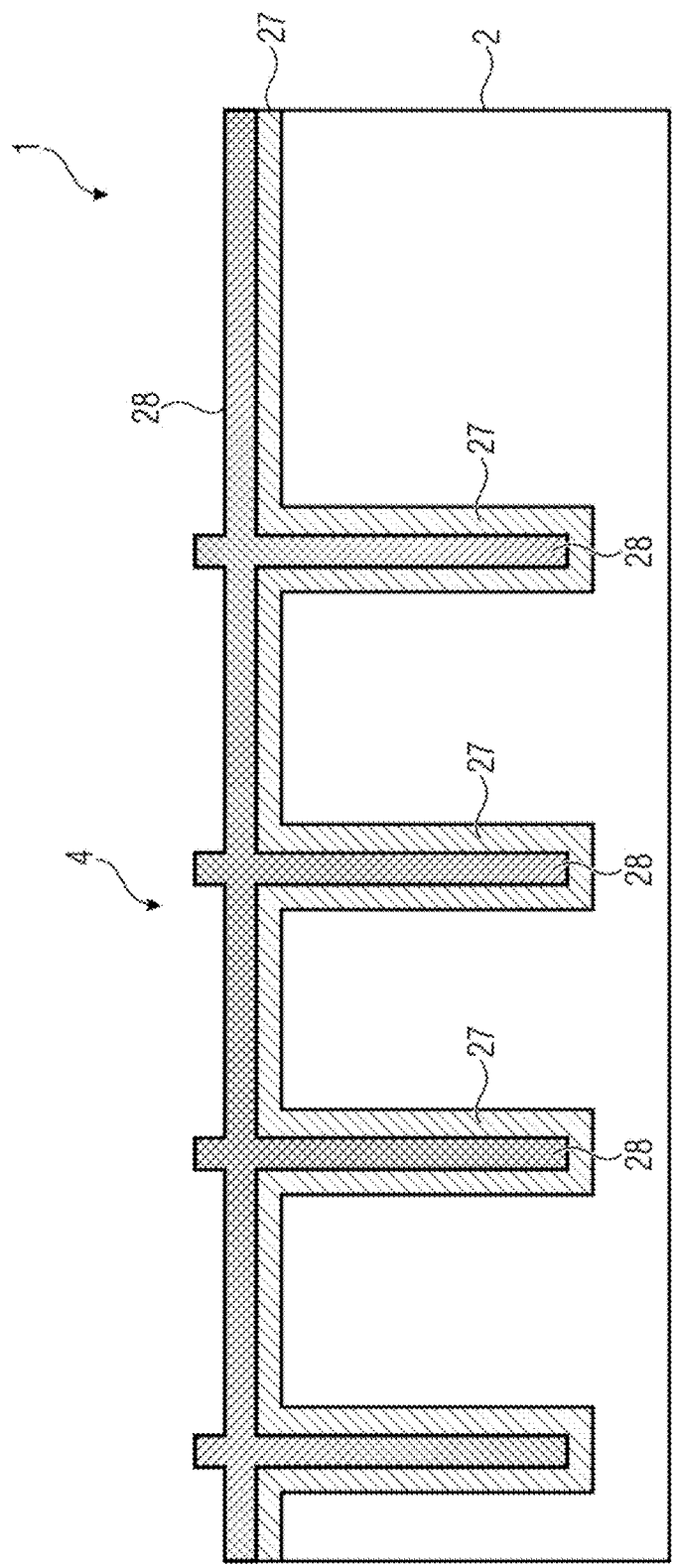
Figure 8:
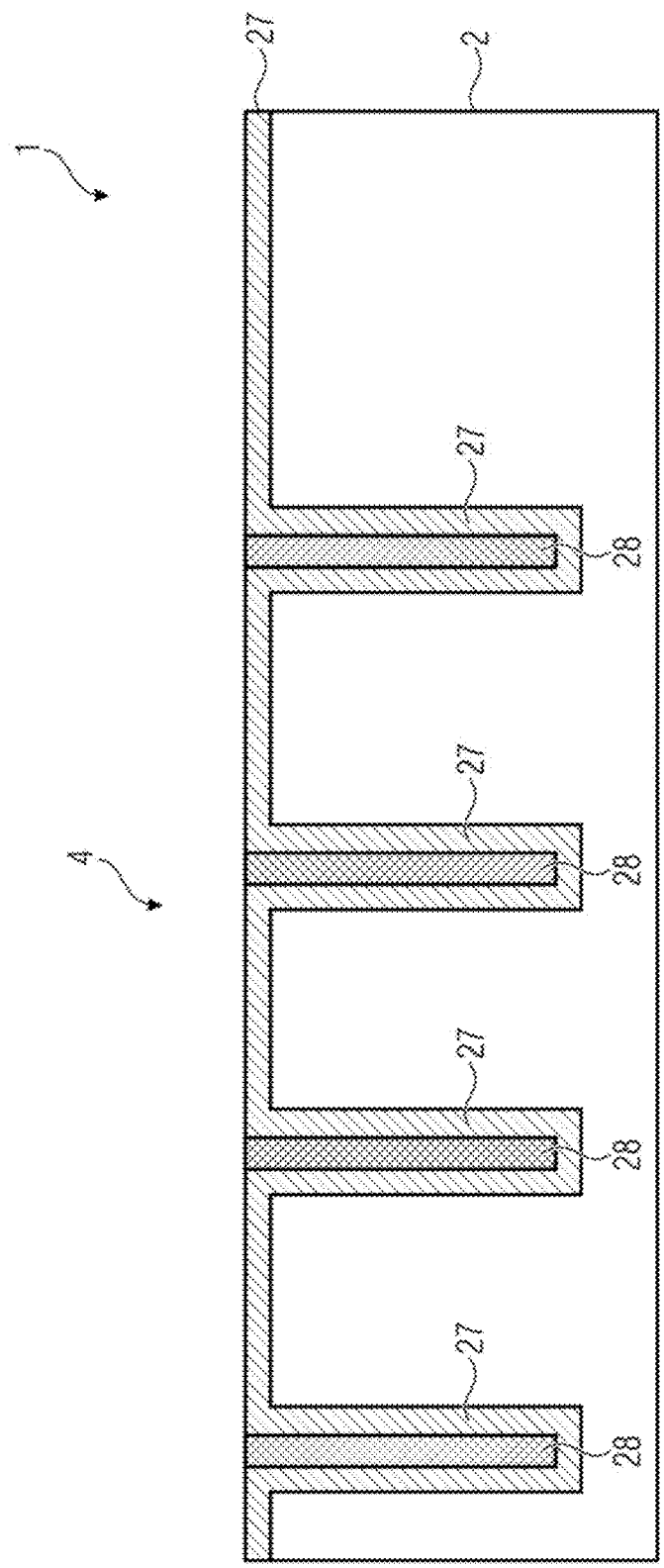
Figure 9:
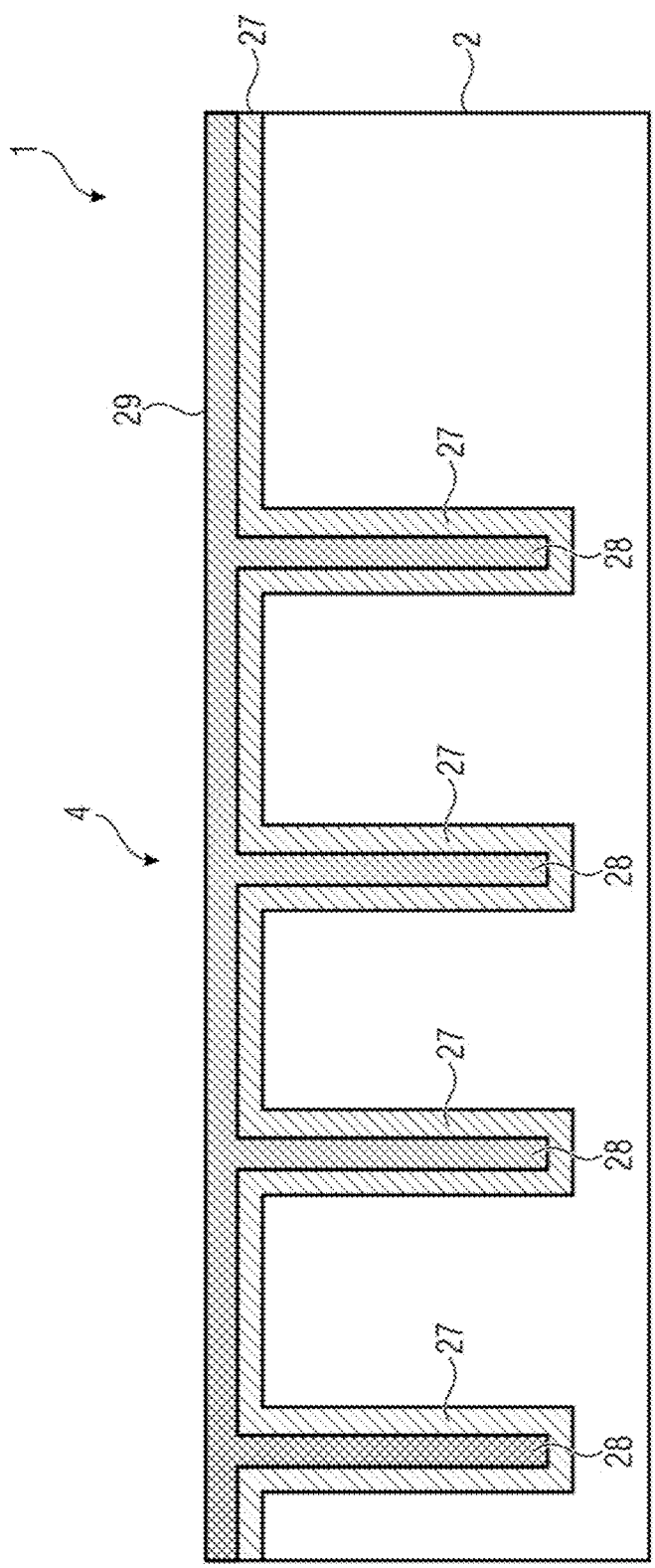

As represented in FIG. 5, by way of example, four trenches 26 are initially formed by etching in the carrier substrate 2 provided. In FIG. 6, it is now represented that the upper side of the carrier substrate 2 is subsequently provided with a first silicon dioxide deposit 27. A first polysilicon deposit 28 is then applied onto the silicon dioxide deposit 27, so that the trenches 26 are entirely filled which is shown in FIG. 7. The polysilicon deposit 28 is not entirely planar on the upper side for technological reasons. Subsequently, as illustrated in FIG. 8, the part of the polysilicon deposit 28 lying above the silicon dioxide deposit 27 is therefore removed by means of chemical-mechanical polishing. As shown in FIG. 9, a second polysilicon deposit 29 is then applied onto the silicon dioxide deposit 27 and the first polysilicon deposit 28, so that there is now a planar surface.

Figure 10:
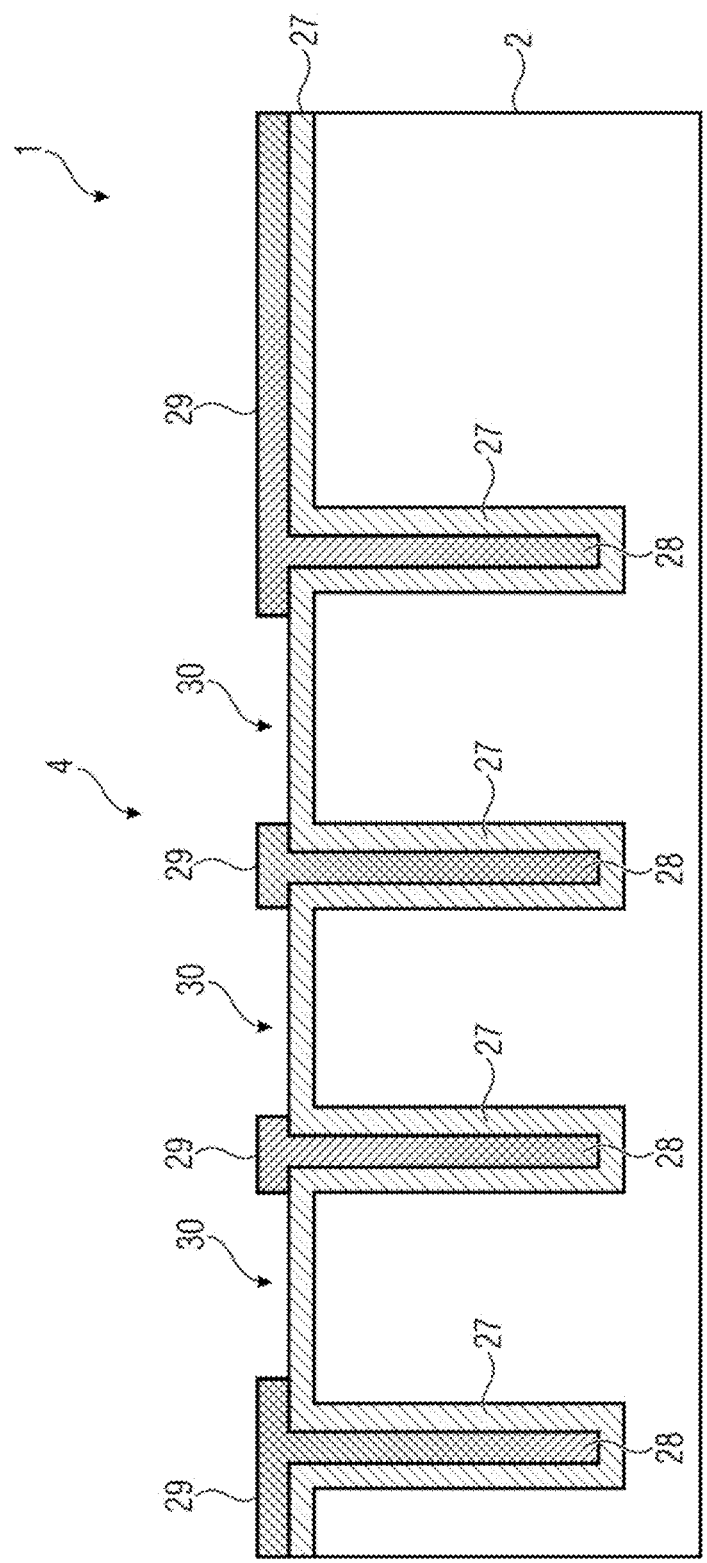
Figure 11:
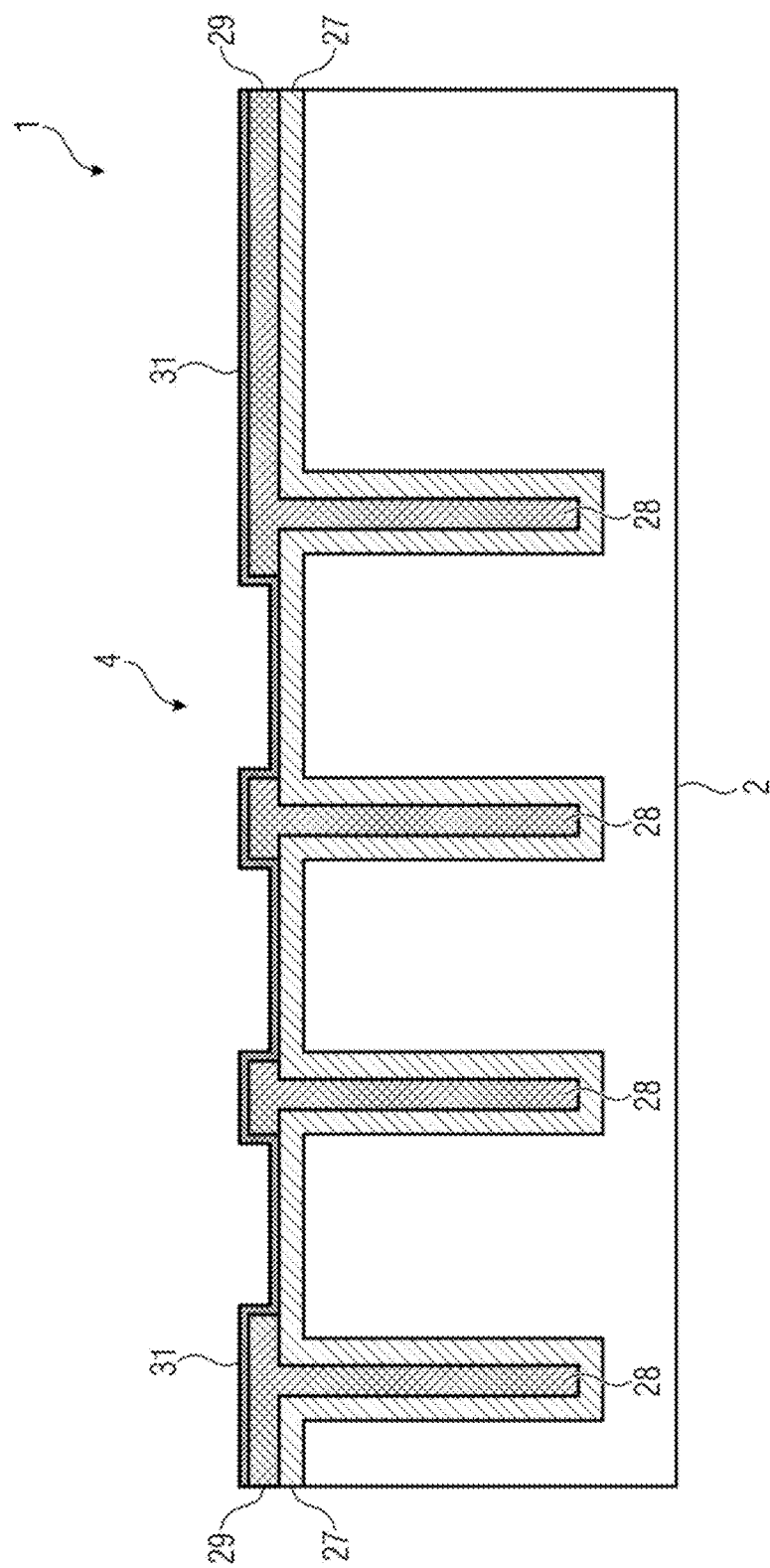
Figure 12:
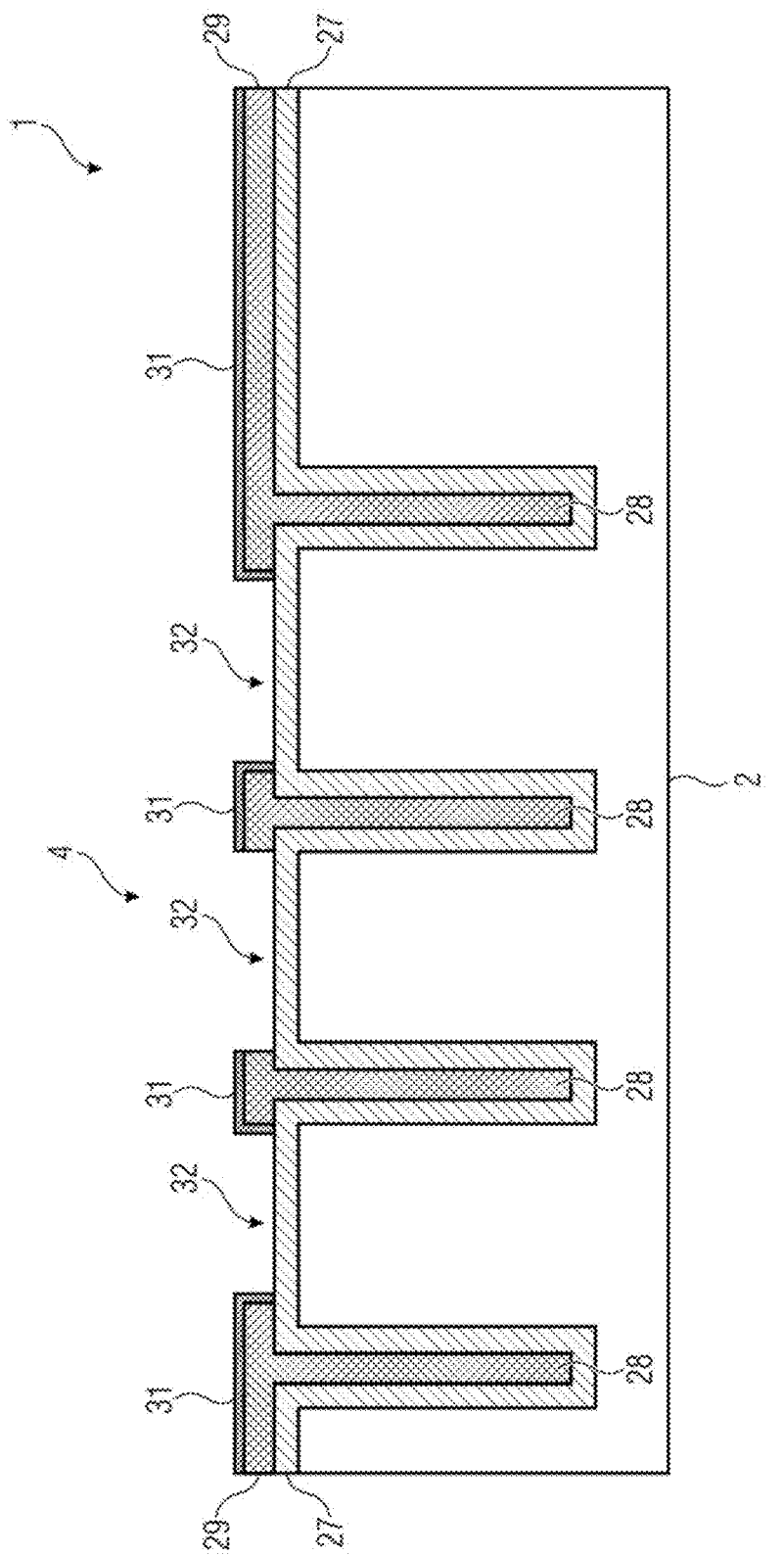
Figure 13:
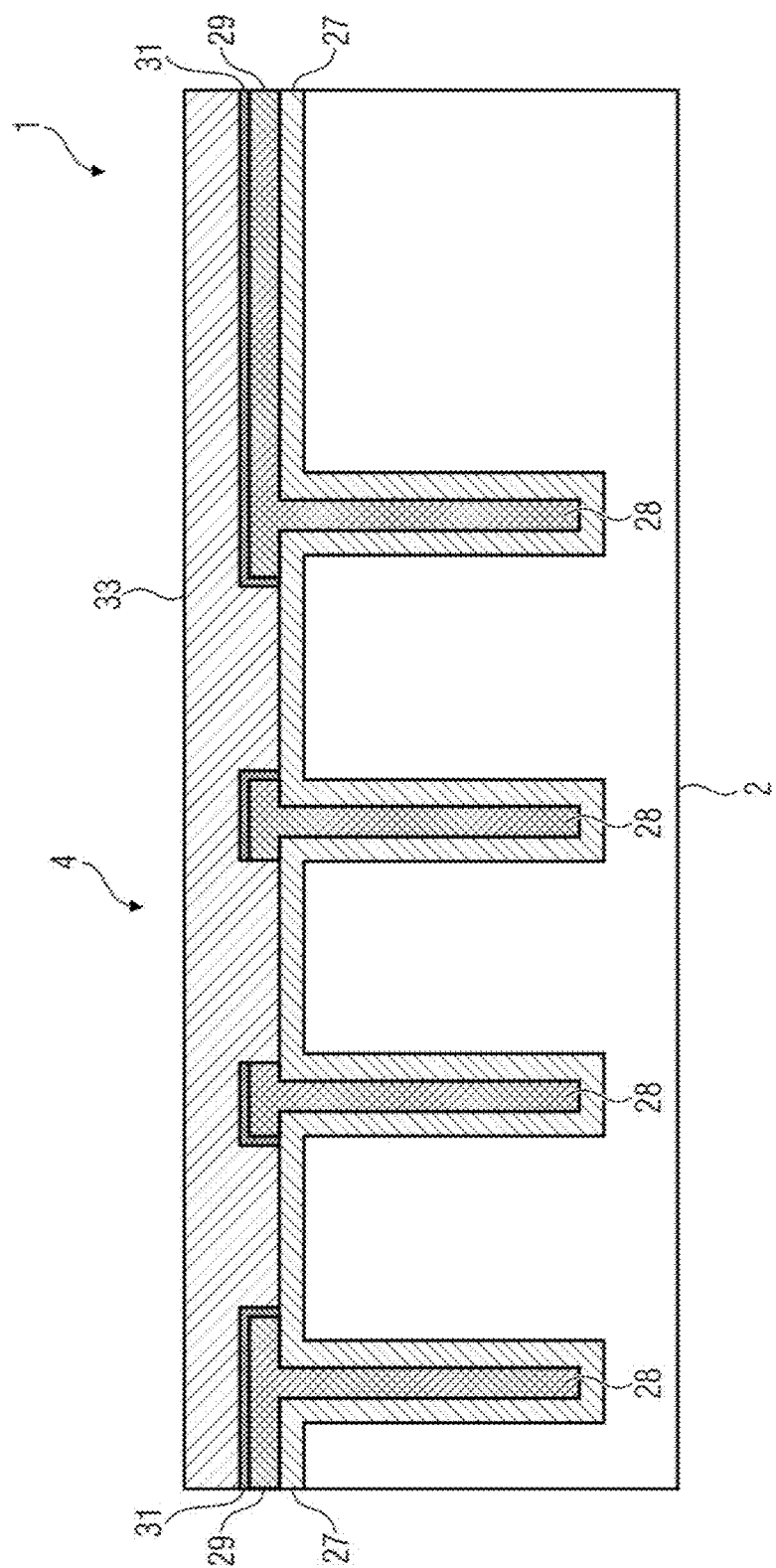
Figure 14:
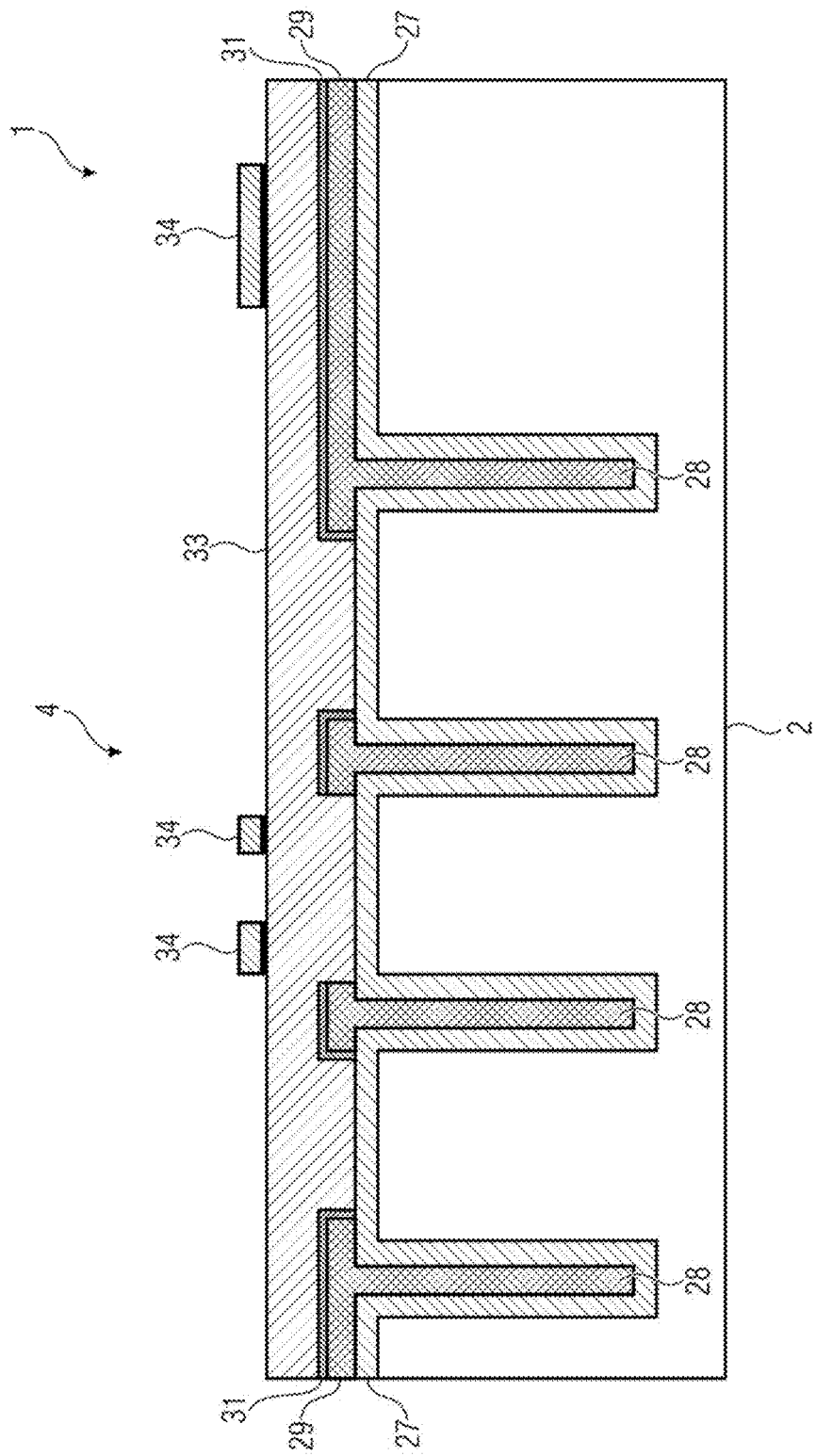
Figure 15:
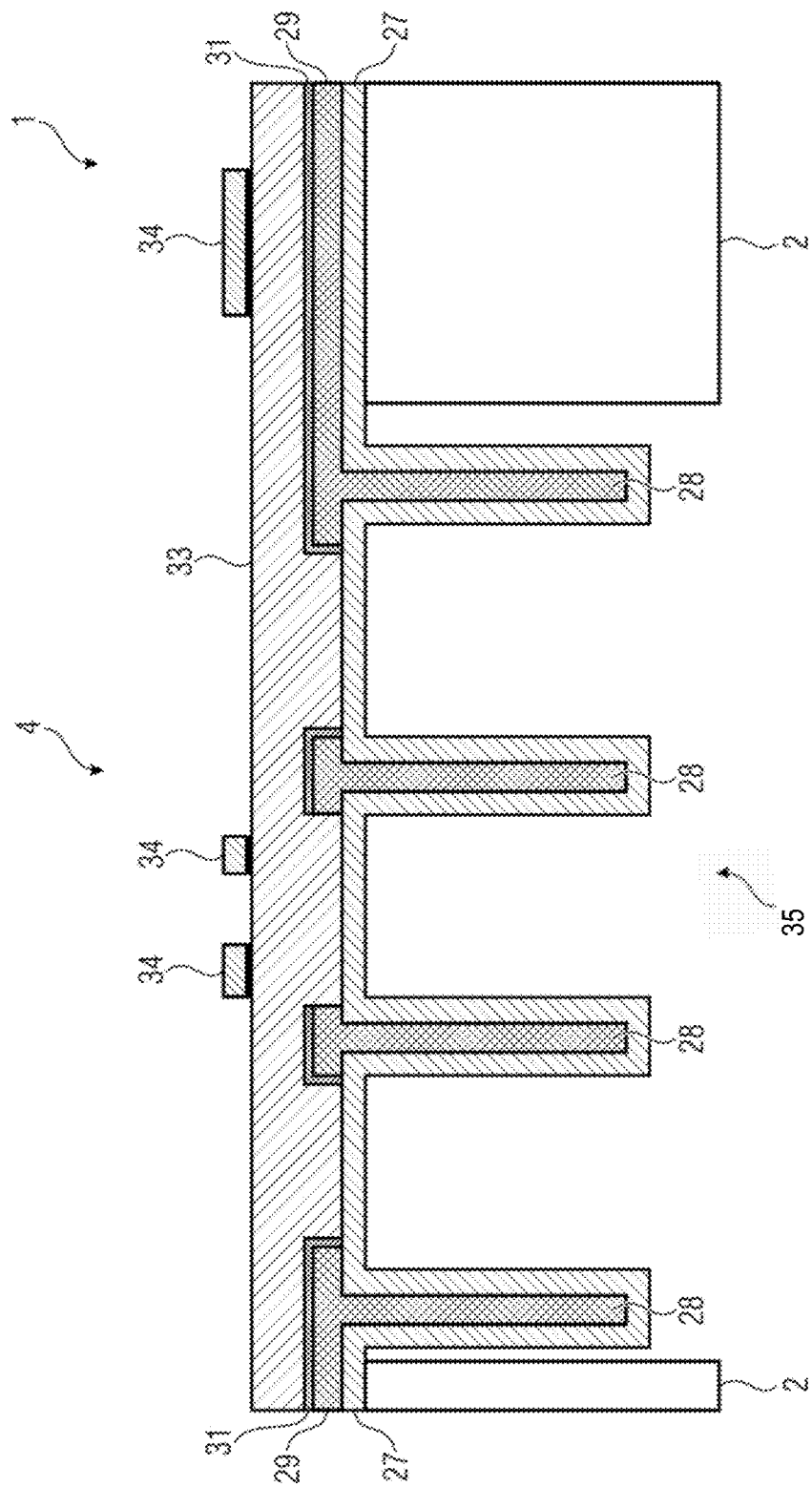
Figure 16:
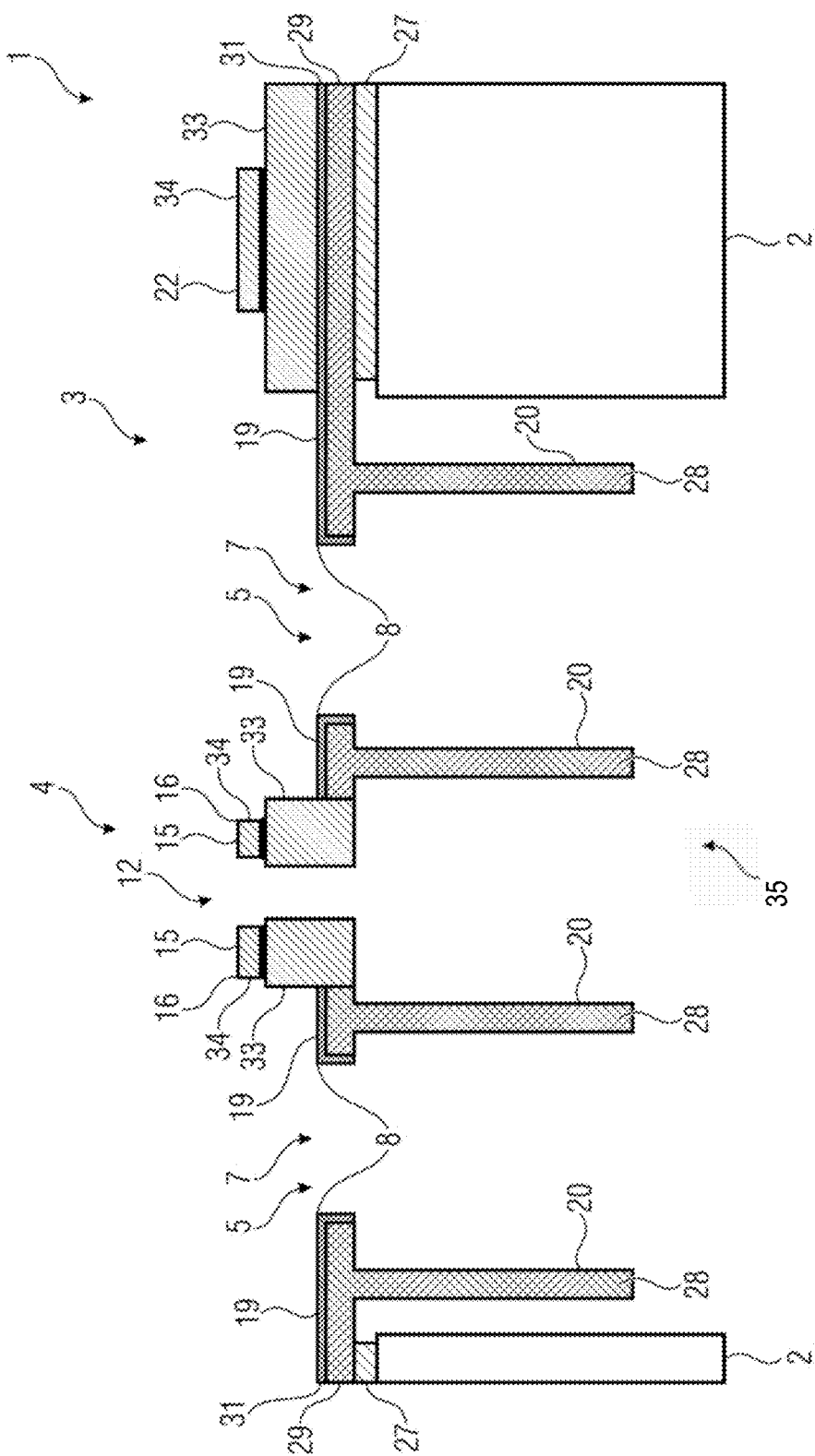

FIG. 10 now represents that the second polysilicon deposit 29 is then structured in such a way that, for example, three openings 30 are formed. In a further step, silicon nitride deposit 31 is applied onto the second polysilicon deposit 29 and the openings 30, which is represented in FIG. 11. FIG. 12 illustrates a further step, in which the silicon nitride deposit 31 is structured in such a way that, for example, three openings 32 are formed. As represented in FIG. 13, a second silicon dioxide deposit 33 is subsequently applied onto the silicon nitride deposit 31 and the openings 32. Onto the second silicon dioxide deposit 33, as shown in FIG. 14, a structured gold deposit 34 is then applied. Next, a recess 35 is formed on the lower side of the carrier substrate 2 by dry reactive-ion etching, which is shown in FIG. 15. In further steps, as shown in FIG. 16, those parts of the first silicon dioxide deposit 27 which directly adjoin the recess 35, as well as parts of the second silicon dioxide layer deposit 33 which are not required for carrying the structured gold deposit 34, are removed by etching.

The carrier structure 3 is now completed. The remaining part of the second polysilicon deposit 29 and the remaining part of the silicon nitride deposit 31 now form the plate-shaped cover 19. The remaining part of the first polysilicon deposit 28 forms, for example, four reinforcing ribs 20. Furthermore, the right-hand part of the structured gold deposit 34 forms one of the counter-electrode connecting plates 22. The left-hand part of the structured gold deposit 34 forms a contact 16, which at the same time forms a frame 15 for the opening 12. A separating structure 5 which is configured as an indentation 7, and which comprises two edges 8, is formed between the two left-hand reinforcing ribs 20. Likewise, a separating structure 5 which is configured as an indentation 7, and which also comprises two edges 8, is formed between the two right-hand reinforcing ribs 20.

Figure 17:
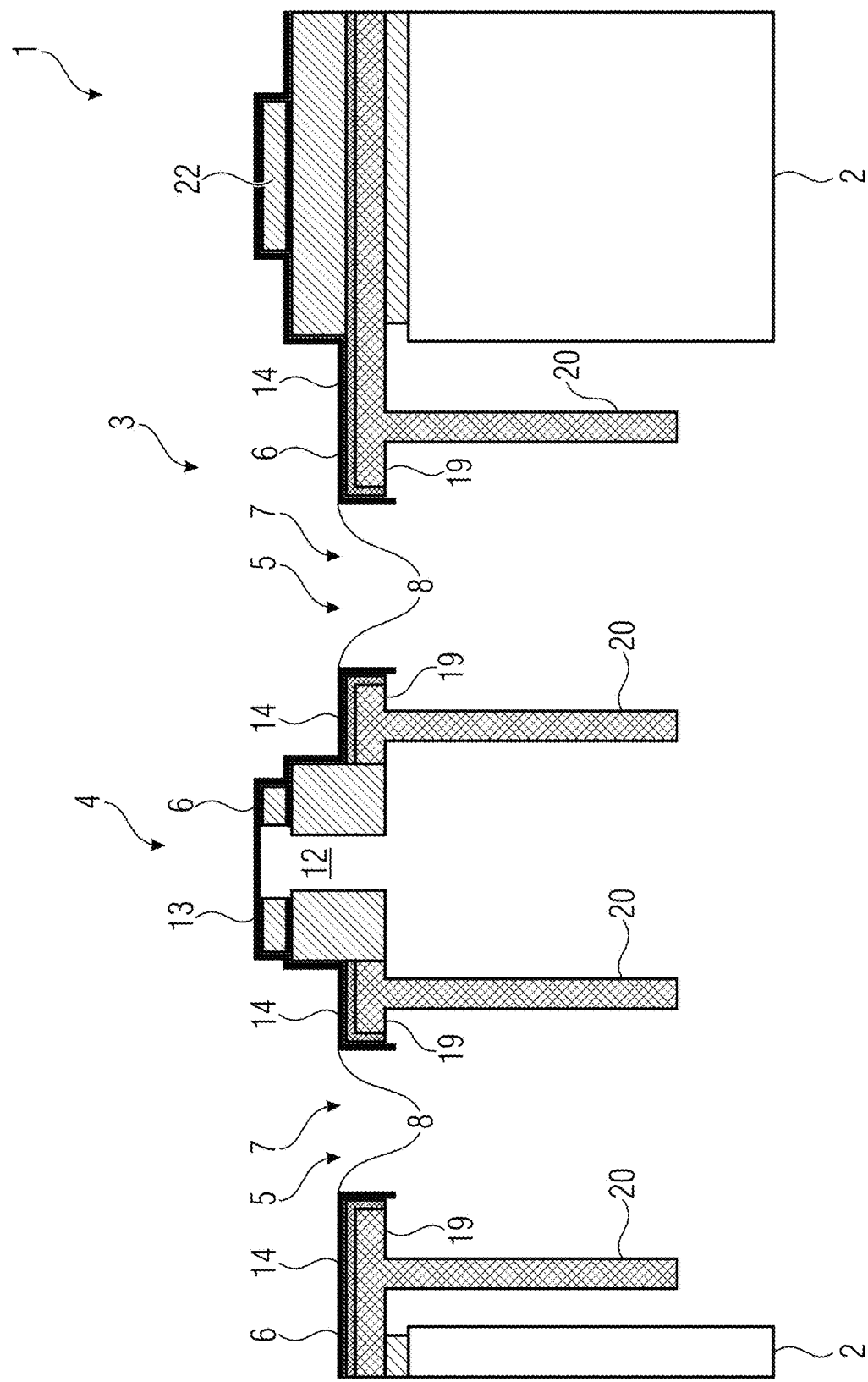
Figure 18:
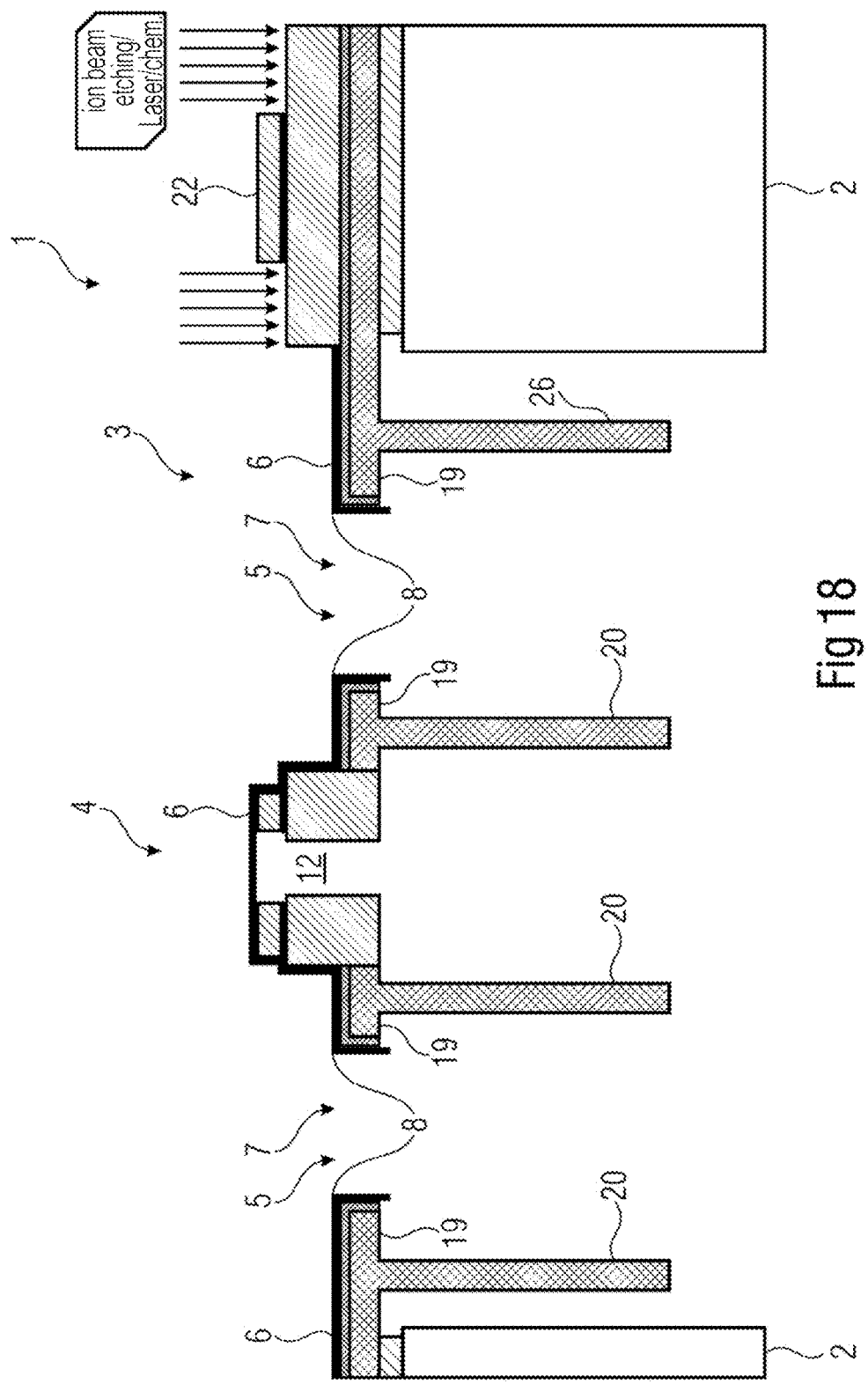

As represented in FIG. 17, the graphene layer 6 is now wet-chemically transferred onto the carrier structure 3 described above. In this case, the graphene layer 6 extends inward in the region of the indentations 7. If necessary, interfering components of the graphene layer 6 may also be removed, example in the region of the counter-electrode connecting plate 22, which is represented in FIG. 18.

Figure 19:
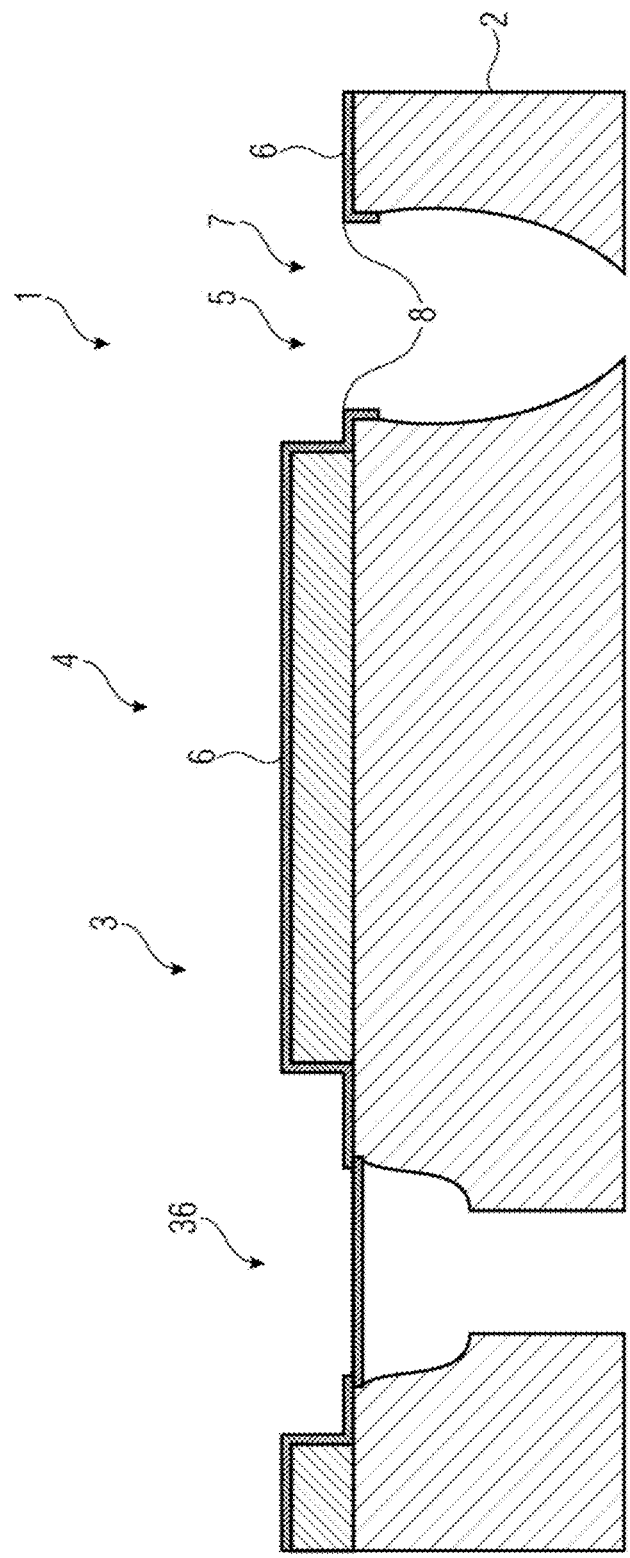
FIG. 19 shows a schematic sectional side view of an exemplary embodiment of a graphene-based sensor.

FIG. 19 shows a schematic sectional side view of an exemplary embodiment of a graphene-based sensor 1, which illustrates the influence of the shaping of an indentation 7 and 36 on the behavior of the graphene layer 6 during the wet chemical transfer onto the infrastructure 3. The indentation 7 in this case comprises an angular upper border, so that the graphene layer 6 tears. By contrast, the indentation 36 comprises a rounded border, so that, with the same width of the indentations 7 and 36, the graphene layer 6 does not tear.

Figure 20:
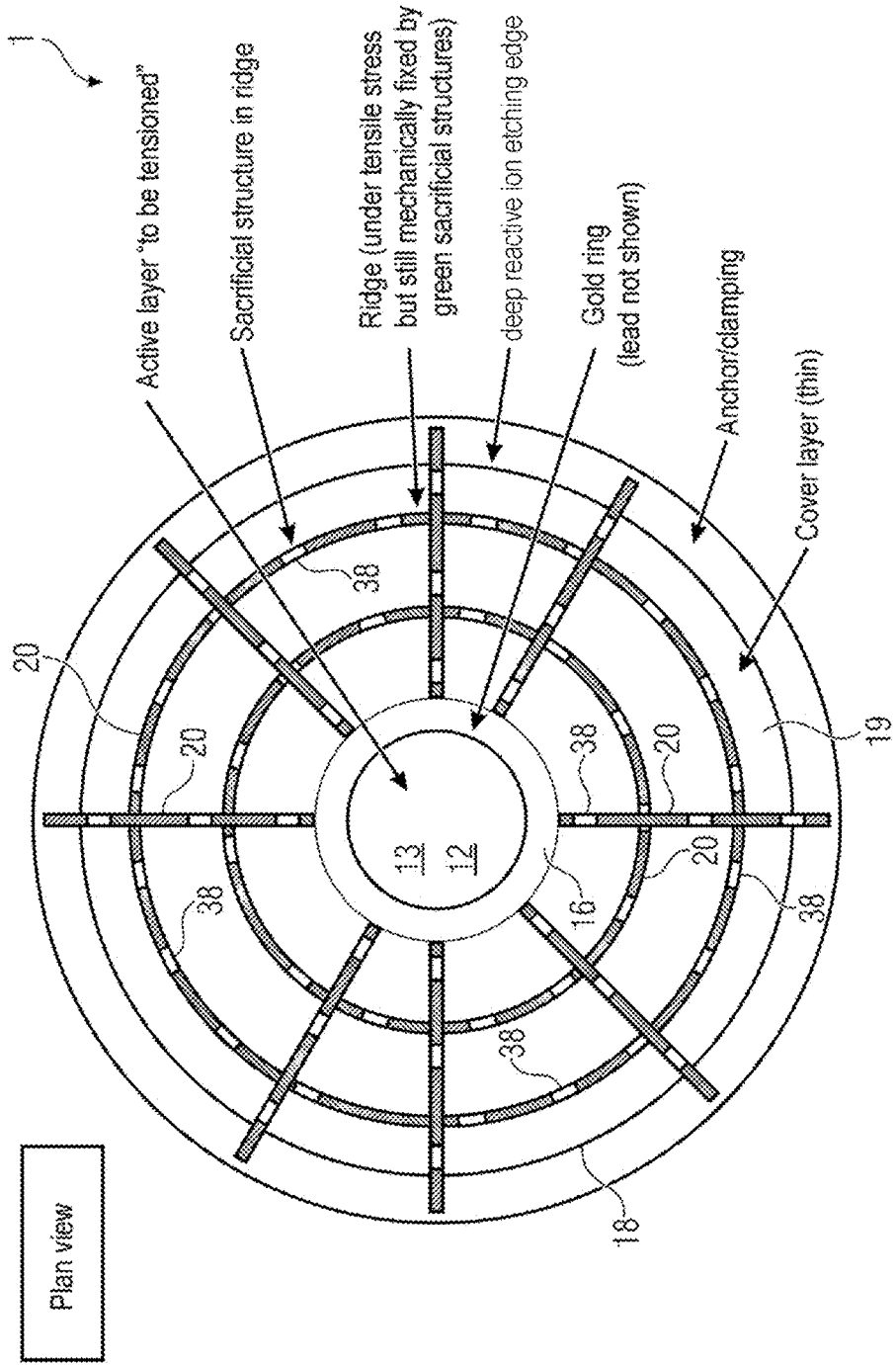
FIG. 20 shows a schematic plan view of a further exemplary embodiment of a graphene-based sensor.

FIG. 20 shows a schematic plan view of a further exemplary embodiment of a graphene-based sensor 1.

Figure 21:
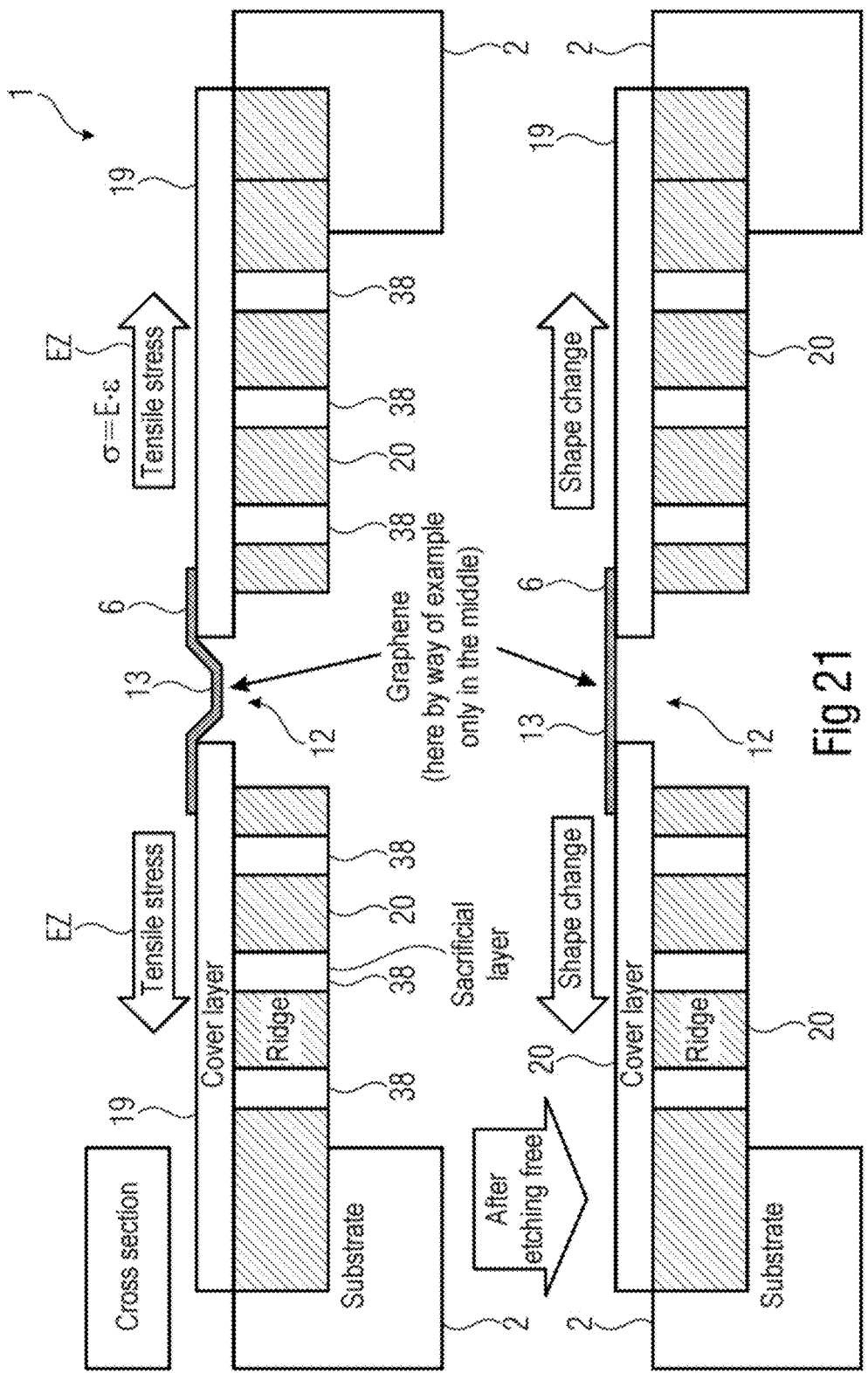
FIG. 21 shows a schematic sectional side view of the further exemplary embodiment of a graphene-based sensor of FIG. 20.

FIG. 21 shows two schematic sectional side views of the further exemplary embodiment of the graphene-based sensor 1 of FIG. 20.

In exemplary embodiments, the carrier structure 3 is pre-stressed before the wet chemical transfer of the graphene layer 6 with resilient tensile forces EZ, and wherein the carrier structure 3 is weakened after the wet chemical transfer of the graphene layer 6 in such a way that an area of the opening 12 is increased by the resilient tensile forces EZ.

In exemplary embodiments, the carrier structure 3 is weakened by removing one or more sacrificial structures 38 of the carrier layer 3.

FIG. 20 is based on FIG. 3, the reinforcing ribs 20 comprising sacrificial structures 38.

The upper part of FIG. 21 shows a situation in which the plate-shaped cover 19 is pre-stressed by the sacrificial structures 38 still present in the carrier structure 3, and the lower part of FIG. 21 shows a situation in which the sacrificial structures 38 in the carrier structure 3 are removed, for example by etching, so that the area of the opening 12 is increased. Because of the increase in the area of the opening 12, the first section 13 of the graphene layer 6 is tensioned, so that the sag, shown in the upper part of FIG. 21, of the first section 13 of the graphene layer 6 is eliminated.

FIG. 22 shows steps of a further exemplary embodiment of a method for producing a graphene-based sensor 1, the graphene-based sensor 1 respectively being represented in a sectional side view.

The upper part of FIG. 22 represents a situation in which the first section 13 of the graphene layer 6 rests on the sag limiting structure 17. This avoids the first section 13 of the graphene layer 6 tearing in the region of the opening 12 despite the relatively large area of the opening 12. The lower part of FIG. 22 represents a situation in which the first section 13 of the graphene layer 6 has been tensioned, as described with the aid of FIGS. 20 and 21.

The embodiments described above are merely illustrative of the principles of the present disclosure. It is to be understood that modifications and variations of the arrangements and of the details described here will be apparent to a person skilled in the art. It is therefore intended to be restricted only by the protective scope of the appended patent claims, and not by the particular details which are presented here by the description and the explanation of the embodiments.

What is claimed is:
1. A method for producing a graphene-based sensor, comprising:
  providing a carrier substrate;
  forming a carrier structure on the carrier substrate, wherein one or more separating structures are formed on an upper side of the carrier structure; and performing a wet chemical transfer of a graphene layer onto the upper side of the carrier structure that comprises the separating structures, wherein the graphene layer is positioned above the separating structures and a tear strength is applied to the graphene layer such that the graphene layer respectively tears at the separating structures during the wet chemical transfer.

2. The method as claimed in claim 1, wherein at least one of the separating structures is configured as an indentation.

3. The method as claimed in claim 2, wherein the indentation is linear and comprises at least one edge extending along the indentation.

4. The method as claimed in claim 1, wherein at least one of the separating structures is configured as an elevation.

5. The method as claimed in claim 4, wherein the elevation is linear and comprises at least one edge extending along the elevation.

6. The method as claimed in claim 5, wherein the linear elevation of the at least one separating structure is a conductor track.

7. The method as claimed in claim 1, wherein at least one of the separating structures comprises a hydrophobic surface.

8. The method as claimed in claim 1, wherein the carrier structure comprises an opening, and wherein the wet chemical transfer causes a first section of the graphene layer to cover the opening, and the wet chemical transfer causes a second section of the graphene layer to cover a region of the carrier structure surrounding the opening.

9. The method as claimed in claim 8, wherein the carrier structure is configured such that the graphene layer tears at the separating structures during the wet chemical transfer, and at least a part of the second section of the graphene layer is electrically separated from the first section of the graphene layer.

10. The method as claimed in claim 8, wherein a frame of the opening is configured as a contact structure having one or more contacts, wherein the contacts are electrically connected to the first section of the graphene layer, and wherein the contacts are respectively configured as one of the separating structures.

11. The method as claimed claim 8, further comprising forming a sag limiting structure at the opening, wherein the sag limiting structure limits sagging of the first section of the graphene layer during the wet chemical transfer of the graphene layer.

12. The method as claimed claim 8, further comprising pre-stressing the carrier structure with resilient tensile forces before performing the wet chemical transfer of the graphene layer, wherein the carrier structure is weakened after the wet chemical transfer of the graphene layer such that an area of the opening is increased by the resilient tensile forces.

13. The method as claimed in claim 12, wherein the carrier structure is weakened by removing one or more sacrificial structures of the carrier substrate.

14. The method as claimed in claim 8, wherein the sensor is configured as a Hall sensor, a microphone or a pressure sensor, wherein the first section of the graphene layer is configured to convert a physical quantity to be detected into an electrical signal.

15. A method for producing a graphene-based sensor, comprising:

forming a carrier structure comprising a separating structure;

pre-stressing the carrier structure with a tensile stress;

forming a graphene layer over the carrier structure after forming the carrier structure, forming the graphene layer comprising performing a wet chemical transfer; and tearing the graphene layer over the separating structure, wherein tearing the graphene layer occurs during the wet chemical transfer.

16. The method of claim 15, wherein pre-stressing the carrier structure comprises pre-stressing the carrier structure with resilient tensile forces before forming the graphene layer.

17. The method of claim 16, wherein pre-stressing the carrier structure comprises forming sacrificial structures in the carrier structure.

18. The method of claim 15, further comprising:

forming an opening in the carrier structure; and forming a sag limiting structure at the opening, wherein the sag limiting structure limits sagging of a first section of the graphene layer during the wet chemical transfer of the graphene layer.

19. The method of claim 15, further comprising forming a Hall sensor, a microphone or a pressure sensor in the carrier structure, wherein the graphene layer is configured to convert a physical quantity to be detected into an electrical signal.

* * * * *